United States Patent [19]
Hopfield

[11] Patent Number: 5,063,417
[45] Date of Patent: Nov. 5, 1991

[54] MOLECULAR SHIFT REGISTER BASED ON ELECTRON TRANSFER

[75] Inventor: John J. Hopfield, Pasadena, Calif.

[73] Assignee: California Institute of Technology, Pasadena, Calif.

[21] Appl. No.: 221,021

[22] Filed: Jul. 18, 1988

[51] Int. Cl.[5] .............................................. H01L 29/28
[52] U.S. Cl. ......................................... 357/8; 357/30; 377/64
[58] Field of Search .............................. 357/8, 30 R, 4; 365/106, 107, 112; 377/57, 64, 80; 350/354

[56] References Cited

U.S. PATENT DOCUMENTS 3,953,874 4/1976 Aviram et al. ........................... 357/8
4,574,161 3/1986 Marks ................................. 357/8 X

OTHER PUBLICATIONS

Moore, T. A. et al., "Photodriven Charge Separation . . ." Nature, vol. 307, pp. 630–632 (Feb. 16, 1984).
Streetman, B., Solid State Electronic Devices, 1972, Prentice-Hall, pp. 362–364.

Primary Examiner—Andrew J. James
Assistant Examiner—Sara W. Crane
Attorney, Agent, or Firm—Benman & Collins

[57] ABSTRACT

An electronic shift register memory (20) at the molecular level is described. The memory elements are based on a chain of electron transfer molecules (22) and the information is shifted by photoinduced (26) electron transfer reactions. The device of the invention integrates designed electronic molecules onto a VLSI substrate (36), providing an example of a "molecular electronic device" which may be fabricated.

20 Claims, 3 Drawing Sheets

Fig. 1a (PRIOR ART)
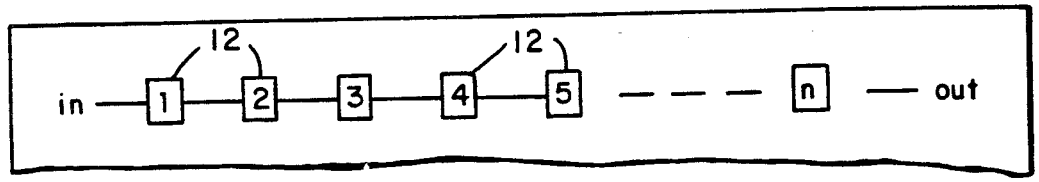
Fig. 1b (PRIOR ART)
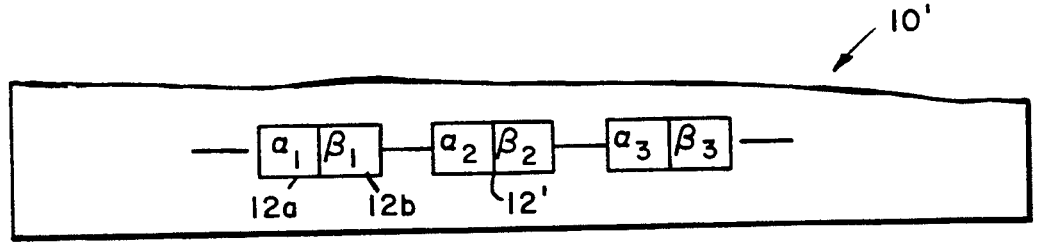
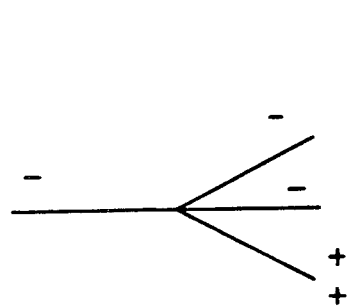
Fig. 5a
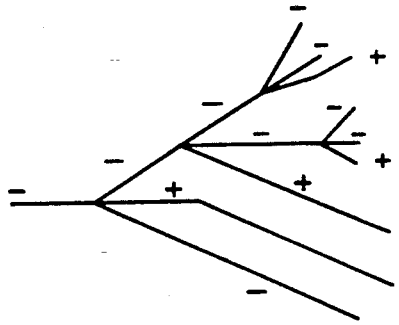
Fig. 5b.
Fig. 2.
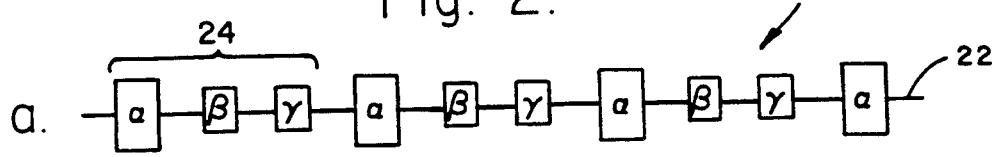
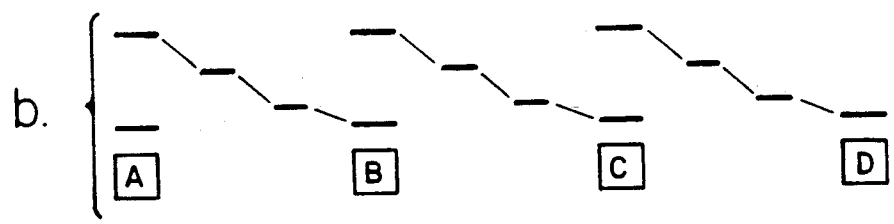

MOLECULAR SHIFT REGISTER BASED ON ELECTRON TRANSFER

ORIGIN OF INVENTION

The present invention was made in the course of work performed under Contract No. N000-14-87-K-0377 awarded by the Office of Naval Research.

TECHNICAL FIELD

The present invention relates to shift registers, and, more particularly, to shift registers comprising molecules and employing an electron transfer mechanism.

BACKGROUND ART

Man-made computing devices at the molecular level have been described in the prior art. In the prior art, the basic computing elements are individual molecules or assemblies of active groups on the scale of 10 to 50 Å. The "state" of such a molecular element is changed by altering the conformation of a given molecule, or by the addition (or subtraction) of an electron or a small chemical group.

There are several chief motivating ideas behind this literature. First, since molecular computation takes place (molecular biology is really a form of computation at the molecular level), it might be possible to build "electronic" or non-biological computational devices at the molecular level. Second, at the molecular level, one can understand how to build "p-n junctions", "photo-junctions", "wires", and even "field-effect transistors"; thus, all the essential elements of VLSI (very large scale integration) technology appear to be present on the molecular scale. Third, both the realities of molecular biology and the theory of computation explain how to do essentially error-free computation with error-prone or erroneously constructed devices. Thus, the inevitable errors of construction, and the "noise" and errors which will be present when the size of computing energies is decreased towards $\approx 50$ kT per decision (instead of the present $\approx 10^{6}$ kT per decision), need not in principle cause errors in the overall computation done by such devices.

These ideas suggest building a molecularly based chip having a device density thousands of times larger than conventional VLSI (very large scale integrated) chips. However, the absence of specific and detailed suggestions for device structure and function has led to justified pessimism about this field.

DISCLOSURE OF INVENTION

In accordance with the invention, a molecular device shift register, employing electron transfer mechanism, is provided. The electronic shift register comprises a plurality of molecular devices formed on a semiconductor substrate which also supports a VLSI circuit, to which the molecular devices are electrically and logically connected. The molecular devices comprise a polymer made up of a plurality of monomeric repeat units, with each monomeric repeat unit comprising at least three different monomers. One of the monomers in each repeat unit is characterized by an electron energy level having a ground state and an upper state to which electrons may be excited, while the remaining monomers in each repeat unit are characterized by an electron energy level having a ground state.

Also in accordance with the invention, a molecular circuit for a shift register comprises a plurality of polymer chains. Each polymer chain is of the same length as the other polymer chains and each polymer chain comprises a plurality of repeat monomeric units, as defined above.

The shift register is immersed in an electrolyte. Exposure of the shift register to intense short pulses of light cause electrons to move from one repeat unit to the next unit.

The shift register of the invention has a memory density of 100 to 1,000 times that obtainable with present VLSI technology.

BRIEF DESCRIPTION OF THE DRAWINGS

FIG. 1a is a schematic diagram of a shift register of the prior art;

FIG. 1b is a schematic diagram of an electronic shift register of the prior art;

FIG. 2a depicts schematically an example of a polymer suitably employed in the invention, using a three-monomer repeat unit;

FIG. 2b depicts the one-electron energy levels of each monomeric unit;

FIG. 5a depicts schematically simple branching of a polymer structure used to construct the molecular device of the invention to achieve a degree of amplification;

FIG. 5b depicts schematically complex branching of the polymer structure to achieve a high degree of amplification;

FIG. 7b is an energy level scheme for the polymer of FIG. 7a.

BEST MODES FOR CARRYING OUT THE INVENTION

Figure 3A:
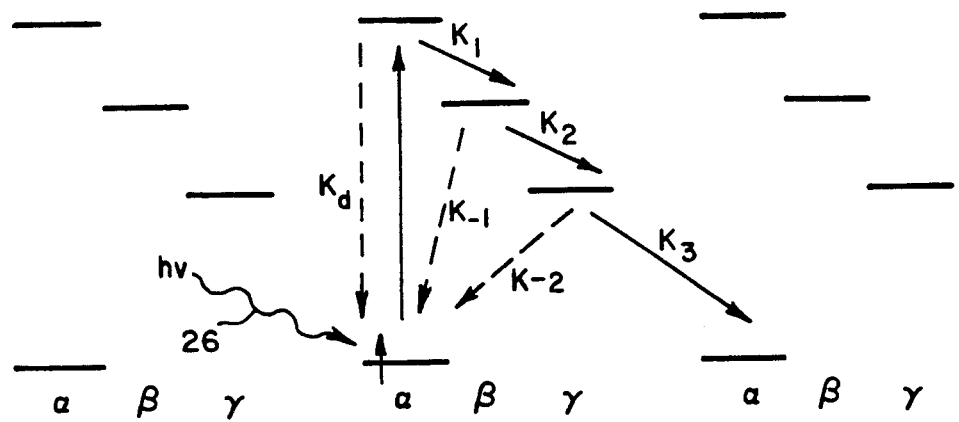
FIGS. 3a and 3b show two strategies for constructing a shift register from a chain of electron transfer active species.

A shift register 10 is a form of memory. In concept, it consists of a set of memory cells 12 connected in a line (FIG. 1a). Each cell stores one bit of information. During each clock cycle, the contents of each cell is shifted to the next register to the right. The first register 1 receives a new bit of information to be stored, while the bit which was in the last register n is transferred to the external circuit.

Electronic shift registers 10' generally involve two information storage sites (12a, 12b) in a single cell 12' (FIG. 1b). Toward the end of a clock cycle, the state of the right half ($\beta_i$) of each cell is the information stored. The early part of the next clock copies the bit in $\beta_i$ of each cell is the information stored. The early part of the next clock cycle copies the bit in $\beta_i$ into $\alpha_{i+1}$, the left hand half of the next cell. The latter part of the clock cycle moves the bit from each $\alpha_i$ into $\beta_i$. By separating the operation into two parts, reliable copies of the information can be copied without confusion. Electronic shift registers 10' are in commercial use as circuit elements for a variety of time-delay and information storage uses. Magnetic bubble memories are a form of shift register.

In accordance with the invention, a physical hybrid, comprising a plurality of molecular devices (described below) and a silicon VLSI-style circuit, on which the molecular devices are built, is provided. The silicon circuit provides the means of making electronic and logical contact, with a molecular structure comprising the molecular devices added thereto. The base silicon chip has various metal and oxide parts exposed, and can be fabricated with 1 μm-scale lithography. Appropriate surface treatments with appropriately designed molecular solutions and electrochemistry can generate a functional chip in which the dominant computation is done by the added molecular devices.

Employing a physical hybrid between the device of the invention and a VLSI-style circuit poses a number of potential problems. These include (1) the means of delivering the energy needed for the computation to the molecules, (2) delivery of the clock signal to the device, (3) fabrication of the molecular device, (4) communicating the molecular information with the micrometer size features of the chip, and (5) dealing with errors.

All of the foregoing problems may be addressed by using molecular electron transfer reactions as the fundamental computing element. A molecular electronic shift register 20 can be made as in FIG. 2. $\alpha\beta\gamma\alpha\beta\gamma\alpha\beta\gamma$ polymer 22 is prepared, as shown in FIG. 2a. FIG. 2b shows the one-electron levels of the units $\alpha$, $\beta$, $\gamma$, $\alpha$, $\beta$, $-\gamma$, . . . For operational purposes, molecular subunits $\beta$ and $\gamma$ have no relevant excited states, and are represented by single energy levels. The units $\alpha$ have two energy levels: a ground state and an upper state to which they can be excited by light.

Each polymer chain 22 comprises a plurality of monomeric repeat units 24, each monomeric repeat unit comprising at least three monomers. In FIG. 2a, three such monomers, $\alpha$, $\beta$, and $\gamma$ are shown. The first monomer in the unit ($\alpha$) is called the donor, while the last monomer in the unit ($\gamma$) is called the acceptor. In between, there may be one or more intermediate monomers ($\beta$).

Let the system initially be partially reduced, with electrons in the ground state of, for example, units $\alpha_2$ and $\alpha_3$, but not in $\alpha_1$ or $\alpha_4$. Assume for the moment that the thermal transition rates for uphill electronic transitions are negligible, and that $\alpha$ units are far enough apart that direct transfer of electrons between different $\alpha$ units is "impossible". In this case, the electronic state $(\alpha_1)(\alpha_2)^-(\alpha_3)^-(\alpha_4)$, is stable, and can be thought of as a stored bit sequence 0110.

Next, expose the polymer to a short intense burst of light 26. If the transitions shown by the solid arrows are much faster than the relevant competing transitions shown by the dashed arrows, each electron (for example starting on unit 3) will go $(\alpha_3)^- \rightarrow (\alpha_3^-)^* \rightarrow (\beta_3)^- \rightarrow (\gamma_3)^- \rightarrow (\alpha_4)^-$, and will thus be moved one unit to the right by the light flash, as seen, for example, in FIG. 3a. Such a polymer forms a molecular shift register, with a single electron representing a stored bit.

Every synchronous chip has two global needs, a power supply and a system clock. The configuration of the invention preferably employs periodic pulses of light, the same everywhere on the chip, to supply these global quantities. At the same time, the optical system required is very simple in that no spatial resolution is required. This is an adequate solution to the first two design problems.

The "logic" of this memory is described by the topology of a line. Information is simply passed along without branching. This is the most elementary logical structure conceivable, and an unbranched polymer structure is a physical structure adequate to implement this logic. Making unbranched polymers comprising a given number of monomer units is a solved problem for both polypeptides and polynucleotides. It is even possible to specify the order of various monomer subunits, as in the case of synthetic proteins. The manufacture of a repeating polymer n units in length, with special attachment groups "start" and "finish" at the two ends, can thus be viewed as a problem which can be solved by modern approaches to specific polymer construction. Thus, difficulty (3) can be circumvented for a circuit as simple as a shift register.

Molecular electron transfer reactions are desirable because they involve no bond formation or breakage, are reversible, have tunable rates, have an intrinsic directionality, and a natural means of connecting the clock with the energy source (i.e., a light source). FIG. 3 shows two strategies for constructing a shift register from a chain of electron transfer active species. These strategies utilize the polymer consisting of three molecular groups per repeat unit described above. A "1" (or "0") is written by reducing (or not reducing) the first repeat unit in the chain which would not be in contact with an electrode. Exposing the chain to short intense bursts of light shifts the written state one repeat unit to the right, provided that the processes indicated with solid arrows are much faster than their competing processes indicated with dashed arrows. The potential of the electrode determines whether a 1 or 0 is written into the shift register during a given light flash. On the three repeat units shown in FIG. 3, the charge state represents the string "010". This design uses periodic light pulses to both provide the power and to be the synchronizing clock signal. Electrons are collected at an electrode (which is also the gate of a transistor) at the terminus of the chain.

In FIG. 3a, three repeat units in an electron transfer shift register scheme are shown, where the electron shift is initiated by excitation of the donor ($\alpha$). The presence of a 1 in the second cell is represented by the presence of the electron (small up arrow). The dotted line represents excitation of the donor by light. Solid lines show the transfer reactions which shift the electron one unit down the chain following photoexcitation. Back reactions which decrease the efficiency of the device are shown with dashed arrows. The relative energies of the orbitals are indicated.

The generic requirements for proper function in systems like the one in FIG. 3a include (1) forward transfer from the excited donor must be much faster than the corresponding radiative plus non-radiative decay to the donor ground state ($k_1 << k_d$); (2) all forward transfers must be faster than reverse transfers ($k_2 >> k_{-1}$ and $k_3 >> k_{-2}$); (3) electron transfer from the excited donor on the site to the right ($k_1$) must be much faster than the recombination rate ($k_{-2}$) to avoid a bottleneck at the connection between cells. (Similar systems with more intermediate states might also be used.)

The intermediate serves the vital function of allowing a first extremely fast charge transfer to compete with unproductive donor excited state decay. The residence of the electron at the intermediate prevents the confusion of the electron "bits" in adjacent cells. This intermediate also provides a large distance between the acceptor and donor states within a single repeat unit. Since electron transfer reactions decay approximately exponentially with distance, intermediates are essential for efficient charge transfer over long distances.

The intermediate electronic state is chosen with properties such that it does not provide a thermodynamically allowed reverse electron transfer reaction to occur. "Intermediates" which do not provide real reduced intermediate states, but serve to increase the electronic coupling between two other species may also prove useful.

Implicit in this discussion is the need for the clock cycle time to be long compared to the time required to transfer an electron from donor to donor. Also, the duration of the light pulse must be short enough that the possibility of charge shifts longer than one repeat unit are eliminated.

Figure 3B:
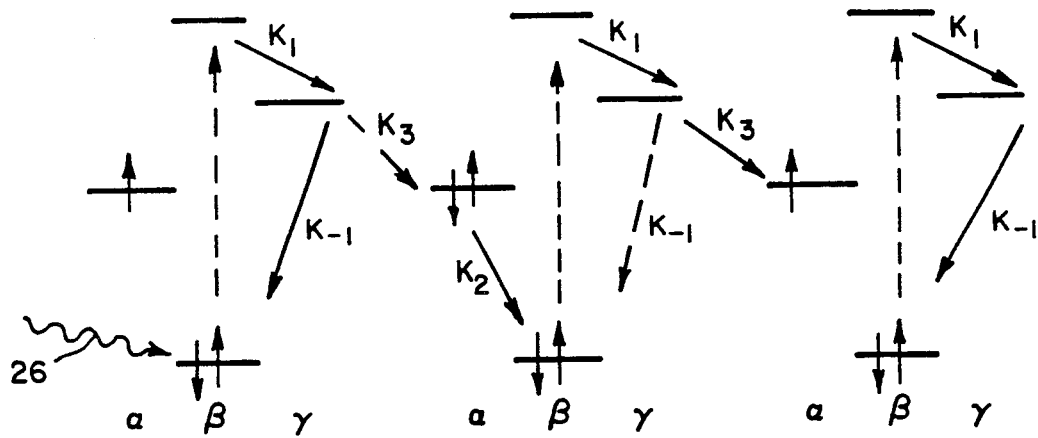

In FIG. 3b, an example is shown where the intermediate ($\beta$) is excited on every unit of the chain every clock cycle. Units which are written with a "0" simply relax back to the ground state via reactions $k_1$ and $k_{-1}$. Proper shifting of the "1", written in the central cell in this example, follows excitation, provided $k_2 >> k_{-1}$ and $k_{-1} >> k_3$. Transfer from $\alpha$ to $\beta$ is only energetically allowed when $\alpha$ is doubly occupied. If the light pulse is long (but shorter than $1/k_3$), each monomer in state "1" may have several chances to form the charge separated state.

Both schemes depicted in FIGS. 3a and 3b could also be equivalently implemented with chiefly filled orbitals in place of the chiefly empty cases illustrated.

Figure 4:
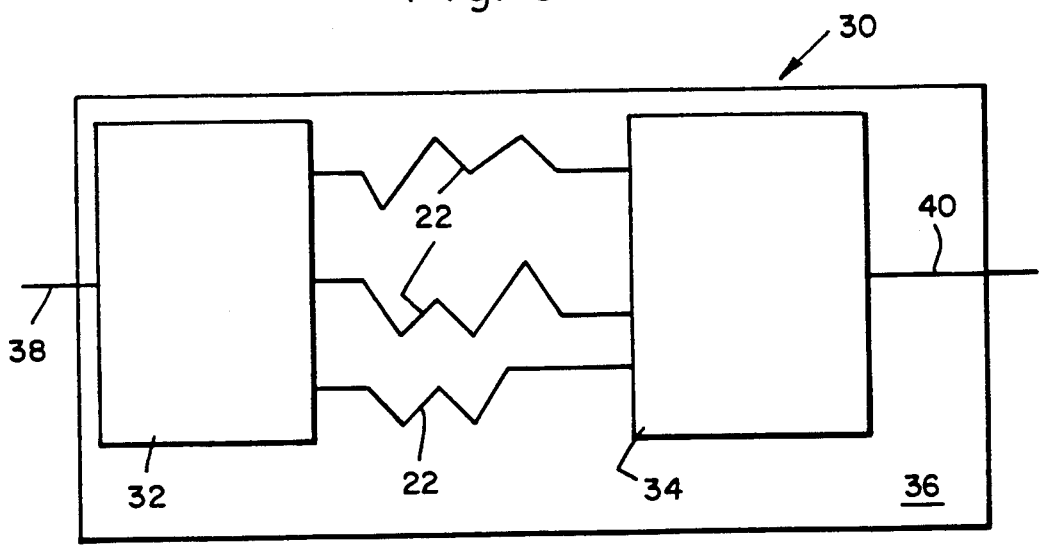
FIG. 4 is a schematic representation of a molecular device in accordance with the invention.

A molecular circuit 30, shown in FIG. 4, is assembled by first binding the head end of about 5000 polymer chains 22, each exactly 600 polymer units long, (600 being a typical value) to one edge of a metal (or doped semiconductor) conducting source electrode 32. This can be done by activating one such edge by a deposition using directional shadowing, and then using the activated area as an electrode to form a covalent bond with a group such as a silal at the head end of the polymer chain. In a similar fashion, the tail of the exactly 600 unit polymer can be covalently linked to an edge of a similarly conducting receiving electrode 34.

Such an assembly of repeat units 24 would provide chains 22 of 1.2 $\mu$m (distance measured along the backbone), assuming that each repeat unit is 20 Å. If there are exactly 600 units 24 in each polymer 22, the precision of manufacturing is absolute, since the electrons move along the polymer paths, even though errors in lithography will produce rough edges of S and R, with local fluctuations of 1,000 Å.

Each such molecular circuit 30, comprising a plurality of polymeric strands 22, is supported on a substrate 36 and is connected to VLSI circuitry (not shown) by input connection 38 and output connection 40.

In operation, the material would be immersed in electrolyte, such as salt water or acetonitrile with TBAP (tetra-butyl ammonium perchlorate), and a third (reference) electrochemical electrode placed in the solution. The ionic strength of the electrolyte should be made adequate to keep the Debye length to $\approx$20 Å. Every clock cycle, the system is excited by an intense short pulse of laser light.

If the source electrode 32 is kept high in potential, unit $\alpha_1$, which is next to the electrode, is oxidized. If electrode 32 is at low potential however, unit $\alpha_1$ will be reduced. A flash of light 26 will move an electron from $\alpha_1 \rightarrow \beta_1 \rightarrow \tau_1 \rightarrow \alpha_2$. If the potential is moved back up, then $\alpha_1$ will be re-oxidized, but unit $\alpha_2$ will stay reduced, since it is not in contact with electrode 32. In this fashion, a "1" or "0" is written into the position $\alpha_2$ in each clock cycle. In each subsequent light pulse, the electrons marking the 1's move one unit 24 to the right. After 600 light flashes, if a 1 was written initially, all 5000 electrons (one from each of the polymers strands) will be deposited on the receiving electrode 34. For example, electrode 34 may be a 1 $\mu$m $\times$ 1$\mu$m gate on a 100 Å film of $SiO_2$ above the silicon transistor conductivity channel to be controlled.

The function of the conductivity in the supporting electrolyte is to eliminate the image charge effect of other electrons near but not yet at the electrode. The "cost" of this screening is that it results in shunt capacitance for the receiving electrode. The number of necessary strands 22 is dictated by the amount of charge which must be delivered to a gate in order to result in a good "1" or "0" being observed at the output of the corresponding transistor. It has been estimated (when appropriately scaled to 1 $\mu$m lithography) that about 1000 electrons will suffice.

It would be possible to detect accurately as few as 100 electrons, but then further stages of amplification would need to be built on the semiconductor chip. In the configuration of the invention, the shunt capacitance due to the electrolyte will be about 5 times the gate-channel capacitance, so that about 5000 electrons will be required. This is why 5000 was chosen for the number of parallel chains 22. Fortunately, this 5000-fold redundancy is not a total waste. If, as is inevitable, a small fraction of the chains have the wrong length, or an electron occasionally does not move forward when struck by light, the parallelism of the 5000 chains 22 will preserve the information, since 5000 independent copies are summed at electrode 34.

The most important single parameter in the molecular design is high transfer efficiency. If the polymers 22 are 600 units long, in order that most of the electrons arrive at the correct time, the transfer probability per step must be at least 0.999. Of course, if the length of the strands is decreased, or several electrons in a row are used to represent a bit, this restriction could be reduced substantially. At the same time, less information would be stored.

The light source must generate a short saturating flash of light 26 every clock cycle. The pulse must be short in order that there is no possibility of two transitions to the right in one clock cycle. To have a probability $\geq$99.9% of exciting a given molecule, the flash of light must be moderately strong. For molecules with a molar extinction coefficient of $10^5$, the pulse must represent an energy flux 20 millijoules/cm$^2$. The actual amount of energy which gets absorbed per clock cycle is still not large.

Each clock cycle, the minimal energy absorption is $1.5 \times 10^{15}$ joules/bit stored/clock cycle. Thus, a 1 cm$^2$ chip storing $10^9$ bits and with a clock speed of 1 megacycle will only dissipate about 1.5 watts. The discrepancy between this and the otherwise expected $0.020 \times 10^6 = 20$ Kilowatts is due to the fact that a chip storing $10^9$ bits on 1 cm$^2$ by these techniques is optically extremely thin, and absorbs very little of the light striking it.

Photosynthetic bacteria have a reaction center which has evolved to have properties very similar to those needed for a monomer of the chain. Such reaction centers contain a sequence of aromatic groups:

| $\alpha'$ | $\alpha$ | $\beta$ | $\gamma$ |
|---|---|---|---|
| cytochrome | bacterial chlorophyll | bacterial pheophytin | ubiquinone | which has a quantum yield for the $\alpha'$ to $\gamma$ photoactivated $\alpha$ charge separation process greater than 95%. The yield has never been measured directly with much precision. A rate of $8 \times 10^7$ sec$^{-1}$ has been determined for the reaction ($\alpha^{+\beta-} \rightarrow \alpha\beta$) by using chemically modified reaction centers. The rate of the electron transfer

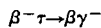

is $7 \times 10^9$ sec$^{-1}$. The competition of these two rates is believed to limit the quantum efficiency of the reaction center. Thus, one would calculate the efficiency to be 98.9%. Note that the limiting feature is the rate of transfer

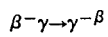

If these two moieties were in closer proximity, this rate would be increased substantially without altering other important aspects of the problem. Thus, synthetic structure of the reaction-center type and having quantum efficiencies >99% will certainly be possible.

While the reaction center is of an $\alpha,\alpha\beta\gamma$structure, a 3-unit monomer should be adequate for the task. Much is known about the design and synthesis of such compounds and about the rate of electron transfer in relevant rigid structures. A synthetic $\alpha'\alpha\beta$ trimer system has been synthesized, but relatively poorly characterized from an electron transfer viewpoint. The conceptual variables are redox energies, chromophore excitation energy, linker type and length, and degree of vibronic coupling.

Major constraints in the design of an $\alpha$-$\beta$-$\gamma$ unit include 1) low vibronic coupling to decrease the rate of back reactions;

2) a rigid linking structure so that molecules are not likely to fold back on themselves;

3) good covalent (perhaps unsaturated) linking pathways for fast transfers;

4) choice of $\alpha,\beta,\gamma$ such that dimerization of different strands of inter-strand electron transfer is unlikely, for example, charged side-groups, bulky hydrocarbon side-groups;

5) excellent resistance to photo-degradation, for example, phthallocyanins rather than porphyrins;

6) appropriate redox levels and excited single and triplet levels;

7) monomers are to be used in polymer synthesis of long ordered chains.

This molecular design problem is certainly solvable, though not easy, within the current framework of chemical synthesis and electron transfer theory. For example, using an alternate route to such a synthesis based on the present ability to synthesize define double-stranded DNA polymers, an appropriate DNA sequence could then be used as a backbone on which to graft $\alpha,\beta,\gamma$ units, which would attach at defined locations on the (periodic) DNA structure.

Figure 6:
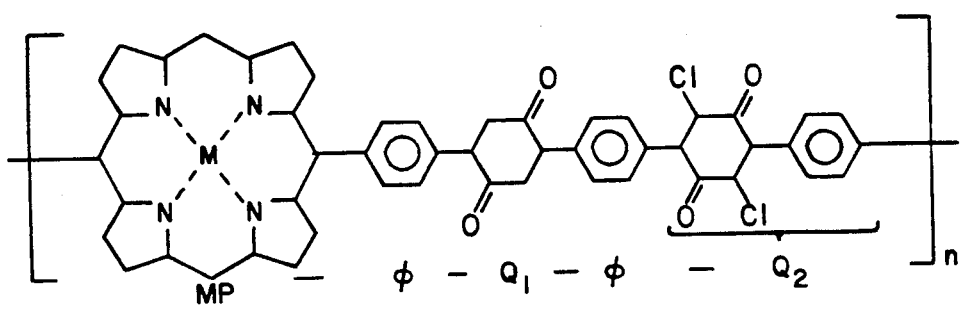
FIG. 6 is an example of an electron transfer polymer suitable in the practice of the invention.
Figure 7A:
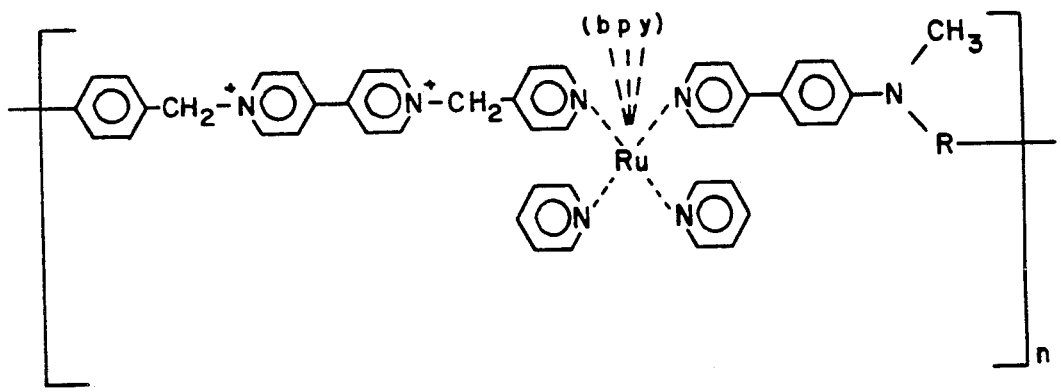
FIG. 7a is another example of an electron transfer suitable in the practice of the invention.

Two examples of electron transfer polymers which may be suitable for use as molecular shift registers are depicted in FIGS. 6 and 7a. The energy level scheme for the polymer shown in FIG. 6 is the same as that depicted in FIG. 3a. In the notation in FIG. 6 listed below the molecule, MP=a metallo-porphyrin, where M=Mg, Zn, Cd, etc., $\phi$=phenyl, $Q_1$=quinone, and $Q_2$=chloroquinone.

Figure 7B:
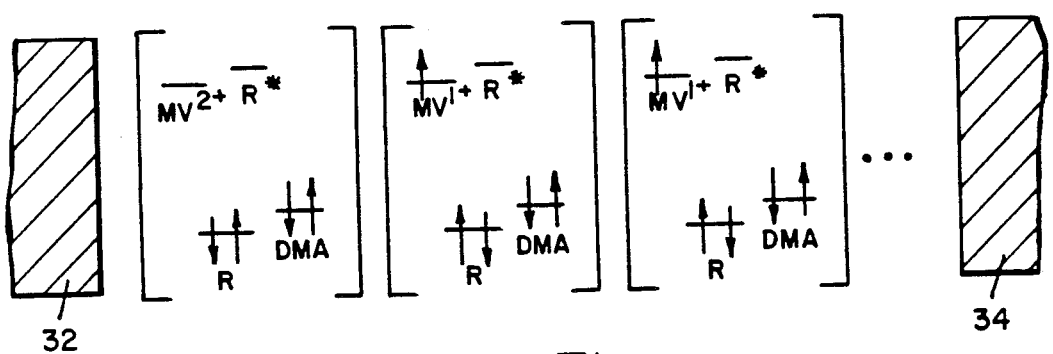

For the polymer shown in FIG. 7a, the energy level is illustrated in FIG. 7b. A null entry must be inserted between all "bits" for the scheme to function properly. In FIG. 7a, bpy=bipyridine and R may comprise a methylene link (—$CH_2$—), a phenyl link ($C_6H_4$) or have a value of zero (direct link from the nitrogen in the ring to the phenyl ring in the next unit). In FIG. 7b, R=ruthenium (bipyridine), MV=methyl viologen, and DMA=dimethyl aniline.

Consideration of this shift register focuses attention on several significant aspects of molecular computation. For instance, while molecularly based computation might reasonable promise computation energies of about 50 kT/bit handled, the present chip design requires about $5 \times 10^5$ kT/bit handled. The shift register design herein makes no progress in energy per bit handled.

The fundamental origin of this ineffectiveness is the unbranched structure of the polymer. The need for 5000 electrons at the end necessitates 5,000 strands 22 everywhere. But suppose a molecular branch unit could be constructed, so that one electron arriving at the fork could generate two electrons and a hole traveling on separate strands as indicated in FIG. 5a. With such a unit, a tree-like structure like that in FIG. 4b can be made which could amplify one electron into 1,000 in 10 branchings. Ten polymer strands, each with a tree at the end, to make 1,000 copies of the charge would then be sufficient. (The electrons would need to be collected at one electrode, and the corresponding holes at another.) This would reduce the energy per bit down to 1,000 kT.

The linear polymer shift register of the invention does the almost trivial job of moving binary bits. The next more complex job in computation is to copy information, which is what the forked molecular polymer structure of FIG. 5 does. Forks seem essential to any larger potential for such molecular devices. There is no present molecular scheme which has demonstrated this fork or copy property, but there are several conceptual approaches to this problem. Some are based on detailed two-electron transfers in particular systems; and others on using an electron to control a tunneling matrix element (analogous to a gate in a field effect transistor).

If digital computation is to be carried out at a molecular level, a "bit" must have a physical representation. Possibilities include representing 1/0 by the presence/absence of an electron, an electronic excited state, an exciton, a soliton, a choice of molecular conformations, a spin, etc. The choice made here of the electron as a bit has the advantage that it interfaces in a natural way with reading and writing by electrical circuits. In addition, the conservation of electrons tends to keep bits from being spontaneously created or destroyed. There are also well-developed methods of moving electron "bits". The absence of a well-developed "copy" procedure is a weakness shared by all the other possible "bit" representations.

It may be a simplification to use light pulses of two different wavelengths for driving such a system. The usual electronic shift register discussed earlier separates the information transfer into two separate steps. This could be done in a molecular shift register as well. A system designed so that $\alpha \rightarrow \beta$ is driven by a wavelength $\lambda_1$, while $\beta \rightarrow \gamma$ is driven by $\lambda_2$ would have the desired property. In use, pulses of $\lambda_1$ and $\lambda_2$ would alternate. The advantages of this scheme is that the light pulses need not be short compared to electron transfer times, since there can be a movement of only one monomer unit per clock cycle regardless of how long the pulses last. Both the demands on the laser and the problem of multi-photon effects are simplified by such a scheme.

Light, which includes that portion of the electromagnetic spectrum from near-IR to visible and near-UV, is one answer to the clock and power supply problem. Using light, the fabrication problem for a real device appears to be within what is understood of chemistry, VLSI, and physics. Light is quite possibly not the only answer, however. As others have noted, diffusing energetic molecules, playing the role of ATP (adenosine triphosphate), could in principle, be a much better power supply. Molecular wires might solve both the clock and/or power supply problems. But such solutions involve technical problems for which detailed solutions are at present lacking.

A shift $\alpha\beta\gamma$ polymer 22 with high efficiency would be interesting in its own right. The general question of light-driven shift polymers can be investigated with far shorter oligomers tethered at only one end, and without the need for microfabrication.

The materials science and chemical synthesis questions raised in such schemes are also of interest for more conventional electronics. For example, much simpler electron transfer polymers could be made to serve as molecular wires over short distances in conventional VLSI without the need for light as a driving source. Short-range self-wiring using such molecules might replace certain metallization or polysilicon layers. This would be particularly attractive if a class of specific surface-to-polymer end bindings (through which electrons could be transferred) were developed. Such an approach relates also to neural network chip architectures, where the connectivity is complex, where wiring faults can be tolerated, and for which connections of having a large resistance can be a central part of a computational circuit. For example, a single strand of half-reduced $\alpha_1 - \alpha_2 - \alpha_3 - \alpha_4 \ldots$ polymer 4,000 units long and having an internal electron transfer rate $\alpha_i \rightleftarrows \alpha_{i+1}$ of f sec$^{-1}$ has an electrical resistance of about $10^{21}/f$ ohms. Since f can be made as large as $10^{11}$ for hopping transfers between very nearby localized sites, a single strand a few micrometers long can have a resistance as low as $10^{10}$ ohms. A single such molecular strand has sufficient conductance to discharge a small VLSI floating gate in a millisecond.

INDUSTRIAL APPLICABILITY

The molecular shift register of the invention is expected to find use as a hybrid in conjunction with VLSI circuits to provide considerably greater information density than presently available.

Thus, a molecular shift register based on electron transfer has been disclosed. It will be appreciated by those skilled in the art that various changes and modifications of an obvious nature may be made without departing from the spirit and scope of the invention, and all such changes and modifications are considered to fall within the scope of the invention as defined by the appended claims.

What is claimed is:

1. An electronic shift register comprising (a) a plurality of molecular devices formed on a semiconductor substrate which also supports a VLSI circuit, to which said molecular devices are electrically and logically connected, said molecular devices comprising a polymer made up of a plurality of monomeric repeat units, each monomeric repeat unit comprising at least three different monomers, with at least one monomer characterized by an electron energy level having a ground state and an upper state to which electrons may be excited and at least one of the remaining monomers characterized by an electron energy level having a ground state only to permit movement of an electron in a predetermined direction, and (b) pulsed light means for exciting an electron to said upper state when light is one and for permitting said electron to decay to a ground state of an adjacent monomer when light is off.

2. The shift register of claim 1 wherein an electron is excited to said upper state by electromagnetic radiation.

3. The shift register of claim 2 wherein said electron is excited by light.

4. The shift register of claim 3 wherein said light is provided by a laser pulse.

5. The shift register of claim 1 wherein said molecular devices comprising a polymer made up of a plurality of monomeric repeat units, each monomeric repeat unit comprising at least three different monomers, two of which have two different energy levels, each requiring different wavelengths of electromagnetic radiation to excite them such that two separate events are required to move electrons forward to the next repeat unit, and the remaining monomers characterized by an electron energy level having a ground state.

6. The shift register of claim 5 wherein said electron is excited by light.

7. The shift register of claim 6 wherein said light is provided by a laser pulse.

8. An electronic shift register comprising (a) a plurality of molecular devices formed on a semiconductor substrate which also supports a VLSI circuit, to which said molecular devices are electrically and logically connected, said molecular devices comprising a polymer made up of a plurality of monomeric repeat units, each monomeric repeat unit comprising at least three different monomers, with one monomer characterized by an electron energy level having a ground state and an upper state to which electrons may be excited and the remaining monomers characterized by an electron energy level having a ground state only to permit movement of an electron in a predetermined direction, and (b) pulsed light means for exciting an electron to said upper state when light is on and for permitting said electron to decay to a ground state of an adjacent monomer when light is off.

9. The shift register of claim 8 wherein an electron is excited to said upper state by light.

10. The shift register of claim 9 wherein said light is provided by a laser pulse.

11. The shift register of claim 8 wherein said repeat unit comprises a donor monomer, at least one intermediate monomer, and an acceptor monomer.

12. A molecular circuit for a shift register comprising a plurality of substantially parallel polymer chains, each polymer chain of the same length as the other polymer chains and comprising a plurality of repeat monomeric units, each monomeric repeat unit comprising at least three different monomers, with at least one monomer characterized by an electron energy level having a ground state and an upper state to which electrons may be excited and the remaining monomers characterized by an electron energy level having a ground state, said molecular circuit adapted to be responsive to pulsed light for exciting an electron to said upper state when light is on and for permitting said electron to decay to a ground state of an adjacent monomer when light is off.

13. The molecular circuit of claim 12 wherein an electron is excited to said upper state by light.

14. The molecular circuit of claim 13 wherein said light is provided by a laser pulse.

15. The molecular circuit of claim 12 wherein said repeat unit comprises a donor monomer, at least one intermediate monomer, and an acceptor monomer.

16. The molecular circuit of claim 12 further comprising a conductive source electrode to which one end of each polymer chain is attached and a conductive receiving electrode to which the other end of each polymer chain is attached.

17. The molecular circuit of claim 12 wherein one of said monomers is characterized by an electron energy level having a ground state and an upper state to which electrons may be excited.

18. The molecular circuit of claim 12 wherein two of said monomers are characterized by an electron energy level having a ground state and an upper state to which electrons may be excited, the difference between said ground state and said upper state being different for each monomer such that two wavelengths of light are required, one to excite an electron in one monomer and the other to excite an electron in the other monomer, thereby requiring two separate events to move an electron forward by one repeat unit.

19. A method of storing and transferring information in a shift register comprising a plurality of molecular devices on a semiconductor substrate which also supports a VLSI circuit, to which said molecular devices are electrically and logically connected, said molecular devices each comprising a plurality of polymeric strands, each polymeric strand made up of a plurality of monomeric repeat units, each monomeric repeat unit comprising at least three different monomers, with one monomer characterized by an electron energy level having a ground state and an upper state to which electrons may be excited and the remaining monomers characterized by an electron energy level having a ground state, one end of each polymeric strand attached to a conductive source electrode, and the opposite end of each polymeric strand attached to a conductive receiving electrode, said method comprising:

(a) immersing said substrate in an electrolyte; and
(b) exciting the molecular devices with intense short pulses of light to cause an electron to be excited to an upper state on one monomer and to decay through successive monomers to the next monomer repeat unit, such that one pulse of light moves an electron from one repeat unit to the next.

20. A method of storing and transferring information in a shift register comprising a plurality of molecular devices on a semiconductor substrate which also supports a VLSI circuit, to which said molecular devices are electrically and logically connected, said molecular devices each comprising a plurality of polymeric strands, each polymeric strand made up of a plurality of monomeric repeat units, each monomeric repeat unit comprising at least three different monomers, with two monomers characterized by an electron energy level having a ground state and an upper state to which electrons may be excited, the difference between said ground state and said upper state being different for said two monomers, and the remaining monomers characterized by an electron energy level having a ground state, one end of each polymeric strand attached to a conductive source electrode, and the opposite end of each polymeric strand attached to a conductive receiving electrode, said method comprising:

(a) immersing said substrate in an electrolyte; and
(b) exciting the molecular devices with intense pulses of light of alternating wavelengths to cause an electron to be excited to an upper state in a first monomer, then to cause an electron to be excited to an upper state in a second monomer and to decay through successive monomers to the next monomer repeat unit, such that two alternating pulses of light of different wavelengths move an electron from one repeat unit to the next.

* * * * *